(12) United States Patent
Kumagai et al.

(10) Patent No.: US 6,469,400 B2
(45) Date of Patent: Oct. 22, 2002

(54) SEMICONDUCTOR MEMORY DEVICE

(75) Inventors: Takashi Kumagai; Masahiro Takeuchi; Satoru Kodaira, all of Chino; Takafumi Noda, Sakata, all of (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/827,155

(22) Filed: Apr. 6, 2001

(65) Prior Publication Data
US 2001/0028081 A1 Oct. 11, 2001

(30) Foreign Application Priority Data
Apr. 11, 2000 (JP) .......................... 2000-109310

(51) Int. Cl.$^7$ ............................. H01L 27/11
(52) U.S. Cl. .................. 257/903; 257/314; 257/355; 257/368
(58) Field of Search ................ 257/314, 355, 257/368, 903; 365/154, 156

(56) References Cited

U.S. PATENT DOCUMENTS

| | | | |
|---|---|---|---|
| 6,005,296 A | * 12/1999 | Chan | 257/368 |
| 6,081,016 A | * 6/2000 | Tanaka et al. | 257/369 |
| 6,407,463 B2 | 12/2000 | Kumagai | |
| 6,169,313 B1 | * 1/2001 | Tsutsumi et al. | 257/390 |
| 6,404,023 B1 | 1/2001 | Mori et al. | |
| 9,758,390 | 1/2001 | Mori et al. | |
| 9,764,449 | 1/2001 | Kumagai et al. | |
| 6,232,670 B1 | * 5/2001 | Kumagai et al. | 257/288 |
| 6,243,286 B1 | * 6/2001 | Kumagai et al. | 257/903 |
| 6,246,605 B1 | * 6/2001 | Ishida et al. | 365/154 |
| 6,271,569 B1 | * 8/2001 | Ishigaki et al. | 257/306 |
| 6,300,229 B1 | * 10/2001 | Tanaka et al. | 257/369 |
| 6,320,234 B1 | * 11/2001 | Karasawa et al. | 257/369 |
| 6,329,693 B1 | * 12/2001 | Kumagai | 257/371 |
| 6,347,048 B2 | * 2/2002 | Kumagai et al. | 257/368 |

FOREIGN PATENT DOCUMENTS

| | | |
|---|---|---|
| JP | A 10-41409 | 2/1998 |
| JP | A 10-178110 | 6/1998 |

OTHER PUBLICATIONS

SRAM Technologies for Mobile Era (Toshiba Review vol. 56, No. 1, 2001) pp. 42–44.
M. Ishida et al., IEDM Technical Digest (1998) p. 203.

* cited by examiner

Primary Examiner—Michael S. Lebentritt
Assistant Examiner—Douglas M. Menz
(74) Attorney, Agent, or Firm—Oliff & Berridge, PLC

(57) ABSTRACT

First and second gate electrode layers located in a first conductive layer, first and second drain-drain connecting layers located in a second conductive layer, and first and second drain-gate connecting layers located in a third conductive layer become conductive layers for forming a flip-flop. First and second contact-conductive sections are formed in a region from an interlayer dielectric between the first and second conductive layers to an interlayer dielectric between the second and third conductive layers. The first drain-gate connecting layer is connected to the second gate electrode layer with the first contact-conductive section interposed. The second drain-gate connecting layer is connected to the first gate electrode layer with the second contact-conductive section interposed.

8 Claims, 16 Drawing Sheets

SEMICONDUCTOR MEMORY DEVICE

Japanese patent application No. 2000-109310, filed Apr. 11, 2000, is hereby incorporated by reference in its entirety.

1. Technical Field

The present invention relates to a semiconductor memory device such as a static random access memory (SRAM).

2. Description of Related Art

An SRAM, which is one type of semiconductor memory device, does not need refreshing. Therefore, the SRAM enables system configuration to be simplified and consumes only a small amount of electric power. Because of this, the SRAM is suitably used as a memory for portable devices such as portable telephones. There has been a demand for miniaturization of portable devices equipped with the SRAM. To deal with this demand, the memory cell size of the SRAM must be reduced.

SUMMARY

An objective of certain embodiments of the present invention is to provide a semiconductor memory device capable of reducing memory cell size.

According to one embodiment of the present invention, there is provided a semiconductor memory device comprising a memory cell which is provided with a first driver transistor, a second driver transistor, a first load transistor, a second load transistor, a first transfer transistor, and a second transfer transistor, wherein:

the memory cell has a first gate electrode layer, a second gate electrode layer, a first drain-drain connecting layer, a second drain-drain connecting layer, a .first drain-gate connecting layer, a second drain-gate connecting layer, a first contact-conductive section, a second contact-conductive section, a first interlayer dielectric, and a second interlayer dielectric;

the first gate electrode layer includes a gate electrode of the first driver transistor and a gate electrode of the first load transistor;the second gate electrode layer includes a gate electrode of the second driver transistor and a gate electrode of the second load transistor;

the first interlayer dielectric is located so as to cover the first and second gate electrode layers;

the first and second drain-drain connecting layers are located over the first interlayer dielectric;

the first and second gate electrode layers are located between the first and second drain-drain connecting layers;

the first drain-drain connecting layer is used to connect a drain region of the first driver transistor to a drain region of the first load transistor;

the second drain-drain connecting layer is used to connect a drain region of the second driver transistor to a drain region of the second load transistor;

the second interlayer dielectric is located so as to cover the first drain-drain connecting layer and the second drain-drain connecting layer;

the first and second drain-gate connecting layers are located over the second interlayer dielectric;

the first drain-gate connecting layer is used to connect the first drain-drain connecting layer to the second gate electrode layer;

the second drain-gate connecting layer is used to connect the second drain-drain connecting layer to the first gate electrode layer;

the first contact-conductive section is located in a first hole formed in a region from the first interlayer dielectric to the second interlayer dielectric;

the second contact-conductive section is located in a second hole formed in a region from the first interlayer dielectric to the second interlayer dielectric;

the first drain-gate connecting layer is connected to the second gate electrode layer with the first contact-conductive section interposed; and the second drain-gate connecting layer is connected to the first gate electrode layer with the second contact-conductive section interposed.

According to another embodiment of the present invention, the first drain-gate connecting layer is connected to the second gate electrode layer and the second drain-gate connecting layer is connected to the first gate electrode layer without forming a contact pad layer between the first and second interlayer dielectrics. Therefore, since the first and second contact-conductive sections can be formed even if the interval between the first and second drain-drain connecting layers is decreased, the memory cell size can be reduced.

The semiconductor memory device according to another embodiment of the present invention includes gate electrode layers which become gates of inverters, drain-drain connecting layers for connecting drains of the inverters, and drain-gate connecting layers for connecting a gate of one inverter to a drain of the other inverter. In the semiconductor memory device according to another embodiment of the present invention, a flip-flop is formed by using these three layers (gate electrode layers, drain-drain connecting layers, and drain-gate connecting layers). Therefore, the pattern of each layer can be simplified (into a linear pattern, for example) in comparison with the case of forming a flip-flop using two layers. Since the pattern of each layer can be thus simplified, a semiconductor memory device with a memory cell size of 4.5 $\mu m^2$ or less can be fabricated, for example.

According to another embodiment of the present invention, the first and second gate electrode layers are located between the first and the second drain-drain connecting layers. Therefore, a source contact layer of the driver transistors can be disposed at the center of the memory cell. Moreover, a wiring in the level as the drain-drain connecting layer to which the source contact layer is connected can be disposed at the center of the memory cell. Therefore, the first and second drain-gate connecting layers can be formed more freely. This also contributes to miniaturization of the memory cell size. Note that the source contact layer is a conductive layer used to connect a source region of a driver transistor to a wiring layer.

Each of the first and second holes may have an aspect ratio of 5 or less. The first hole and the second hole with an aspect ratio of 5 or less can be easily filled with the contact-conductive sections.

Each of the first and second drain-drain connecting layers may have a thickness of 100 nm to 170 nm. This is because the first and second drain-drain connecting layers with a thickness of 100 nm or more exhibit preferable electric resistance values. If the thickness of the first and second drain-drain connecting layers is 170 nm or less, the thickness of the second interlayer dielectric does not become unduly great. This ensures that the aspect ratio of the first and second holes is 5 or less. The thickness of the first and second drain-drain connecting layers can be adjusted to 170 nm or less by allowing a high-melting-point metal nitride layer such as titanium nitride to be included in the first and second drain-drain connecting layers.

Each of the first gate electrode layer, the second gate electrode layer, the first drain-drain connecting layer and the second drain-drain connecting layer may have a linear pattern and they may be disposed in parallel. If the pattern of each layer is simple, a semiconductor memory device with a minute memory cell size can be provided.

According to another embodiment of the present invention, the memory cell may further comprise a third contact-conductive section, a fourth contact-conductive section, a first contact pad layer and a second contact pad layer;

the first contact pad layer and the second contact pad layer may respectively be located in the same level as the first drain-drain connecting layer and the second drain-drain connecting layer;

the third contact-conductive section and the fourth contact-conductive section may be located in holes formed in the first interlayer dielectric;

a source/drain region of the first transfer transistor may be connected to the first contact pad layer with the third contact-conductive section interposed; and a source/drain region of the second transfer transistor may be connected to the second contact pad layer with the fourth contact-conductive section interposed.

If each memory cell includes the first contact pad layer, the source/drain region of the first transfer transistor can be connected to an upper wiring (bit line, for example) more reliably. Moreover, if each memory cell includes the second contact pad layer, the source/drain region of the second transfer transistor can be connected to an upper wiring (bit line, for example) more reliably. Note that the contact pad layer is a conductive layer for connecting the contact-conductive section formed in the hole in the interlayer dielectric to the contact-conductive section formed in the hole in the interlayer dielectric located thereon.

According to another embodiment of the present invention, the first and second driver transistors may be n-type;

the first and second load transistors may be p-type;

the first and second transfer transistors may be n-type;

the memory cell may include a first conductive layer, a second conductive layer, a third conductive layer and a fourth conductive layer;

the first gate electrode layer, the second gate electrode layer, and a sub-word line may be located in the first conductive layer;

the first drain-drain connecting layer, the second drain-drain connecting layer, a power supply line, a first contact pad layer, a second contact pad layer and a third contact pad layer may be located in the second conductive layer;

the first drain-gate connecting layer, the second drain-gate connecting layer, a main-word line, a fourth contact pad layer, a fifth contact pad layer and a sixth contact pad layer may be located in the third conductive layer;

a first bit line, a second bit line and a ground line may be located in the fourth conductive layer;

the sub-word line may extend in a first direction;

the power supply line may be connected to source regions of the first and second load transistors;

the first contact pad layer may be used to connect the first bit line to a source/drain region of the first transfer transistor;

the second contact pad layer may be used to connect the second bit line to a source/drain region of the second transfer transistor;

the third contact pad layer may be used to connect source regions of the first and second driver transistors to the ground line;

the main-word line may extend in the first direction;

the fourth contact pad layer may be used to connect the first bit line to a source/drain region of the first transfer transistor;

the fifth contact pad layer may be used to connect the second bit line to a source/drain region of the second transfer transistor;

the sixth contact pad layer may be used to connect source regions of the first and second driver transistors to the ground line; and the first and second bit lines may extend in a second direction which is perpendicular to the first direction.

According to another embodiment of the present invention, various properties (such as miniaturization, reliability, stability, and speed) required, for semiconductor memory devices can be well-balanced and improved.

DETAILED DESCRIPTION

An embodiment of the semiconductor memory device according to the present invention will be described below. The present embodiment illustrates the case where the semiconductor memory device according to the present invention is applied to an SRAM. The outline of the structure of the present embodiment, the details of the structure, and the major effects of the present embodiment are described below.

1. Outline of Structure of the Present Embodiment

The semiconductor memory device of the present embodiment is a type of memory in which one memory cell is formed by six MOS field effect transistors. The outline of the structure of the present embodiment is described below by separately describing the structure of a section which forms a flip-flop of the memory cell and the structure of the memory cell.

1.1 Structure of Section which Forms Flip-flop of Memory Cell

Figure 1:
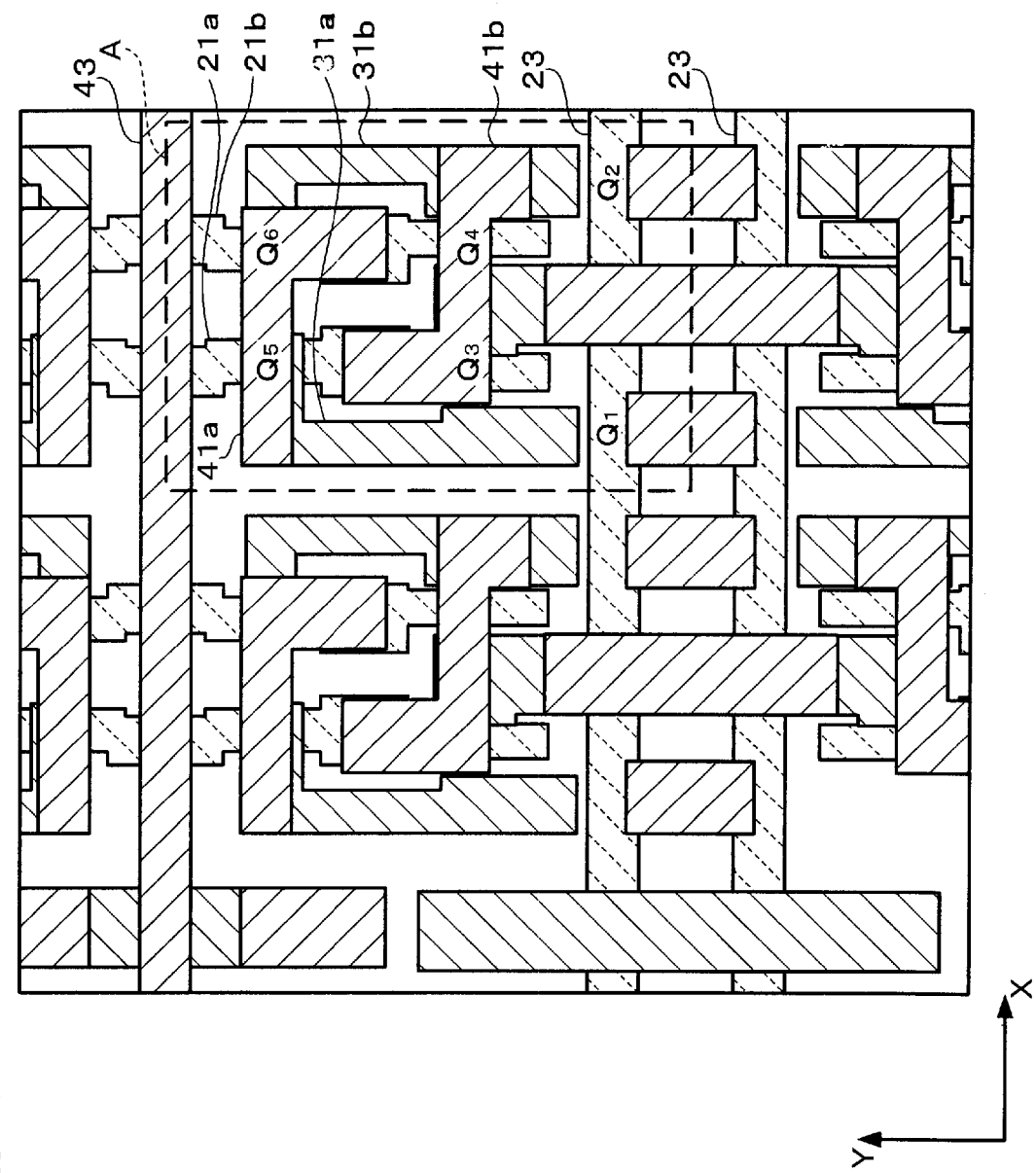
FIG. 1 is a plan view showing first, second and third conductive layers in part of a memory cell array of the embodiment of the present invention.

FIG. 1 is a plan view showing a first conductive layer, a second conductive layer, and a third conductive layer in part of a memory cell array of the present embodiment. The first conductive layer, the second conductive layer, and the third conductive layer are individually described to ensure that FIG. 1 is readily understood.

Figure 3:
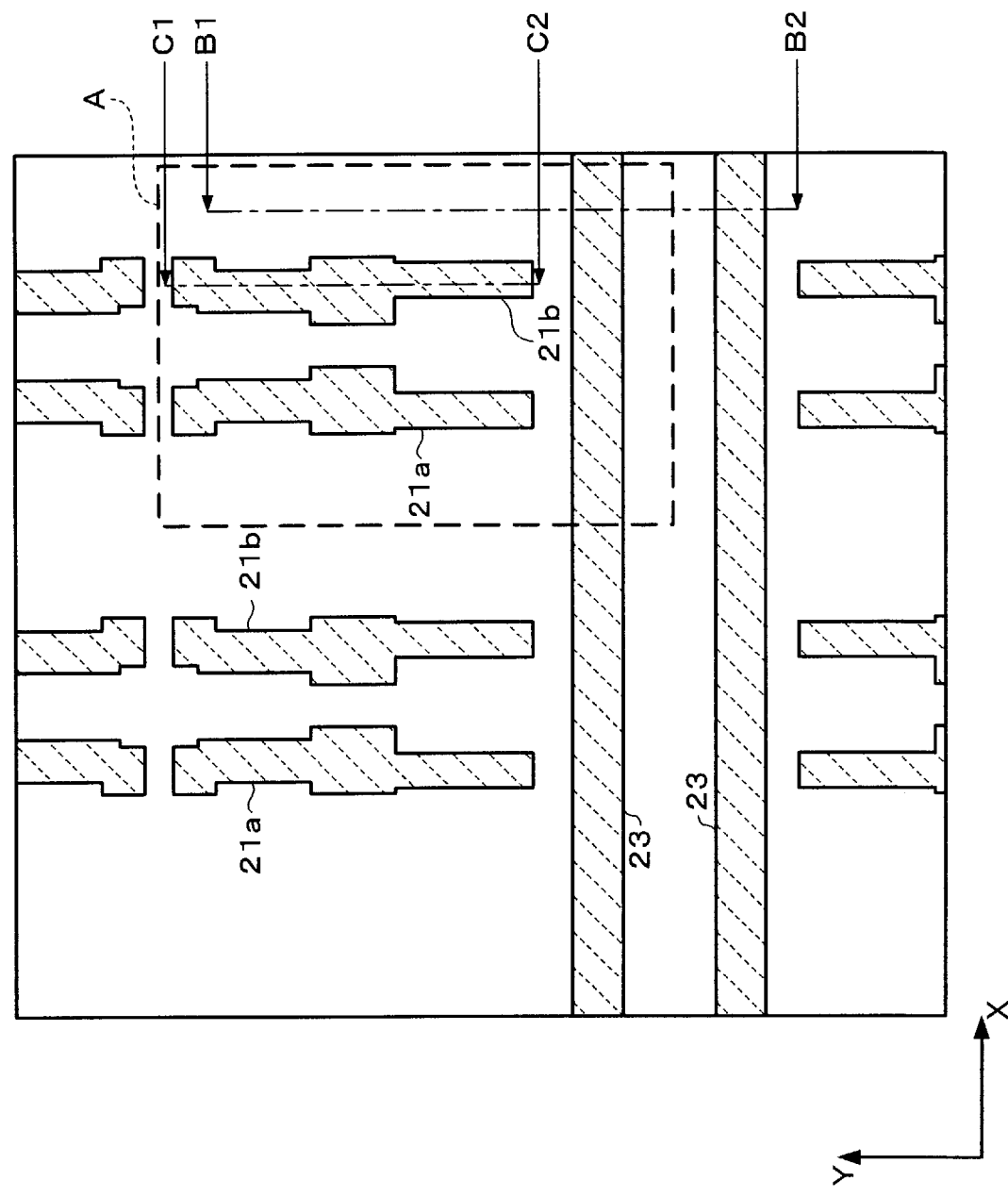
FIG. 3 is a plan view showing the first conductive layer in part of the memory cell array of the embodiment of the present invention.
Figure 5:
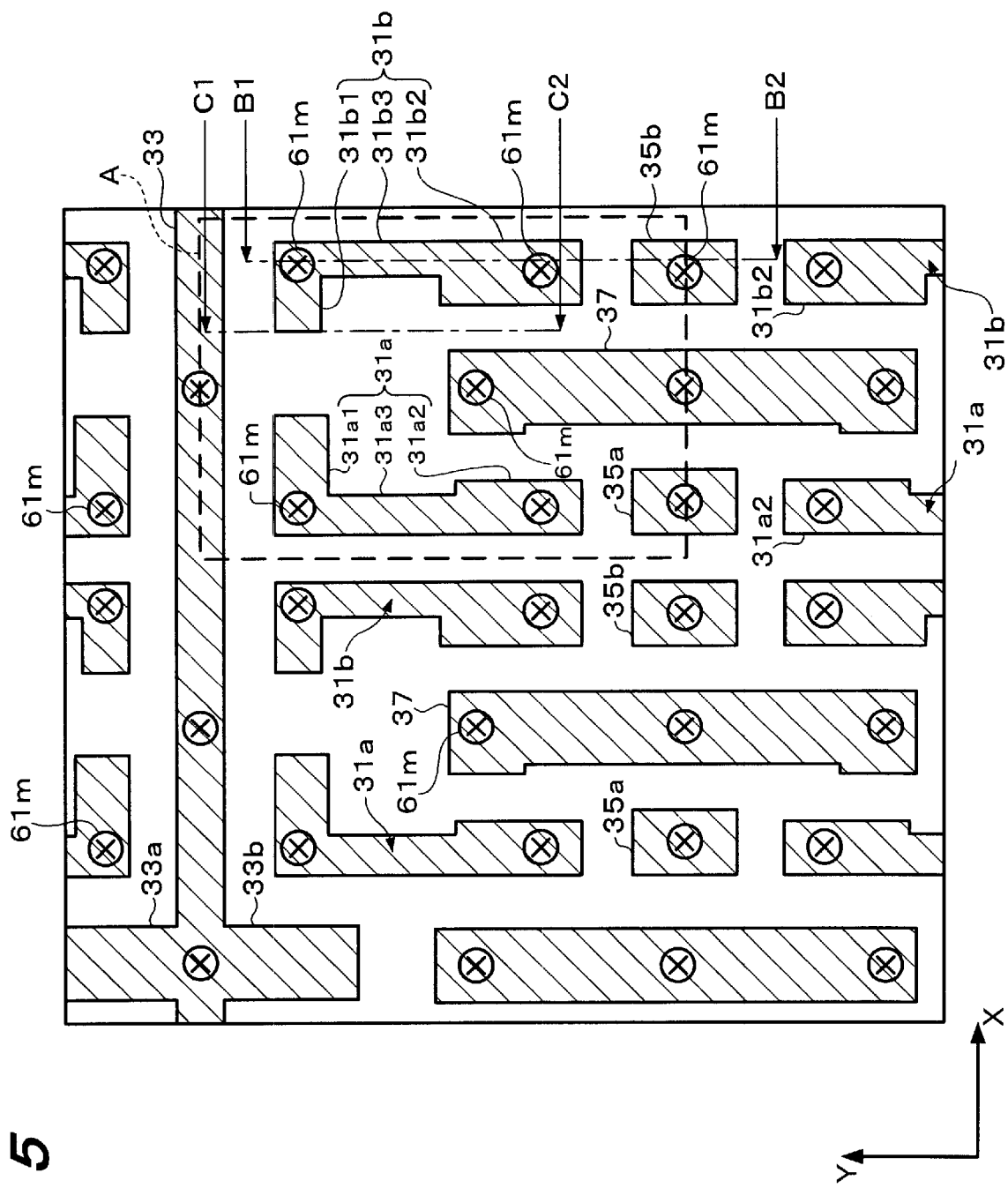
FIG. 5 is a plan view showing the second conductive layer in part of the memory cell array of the embodiment of the present invention.
Figure 8:
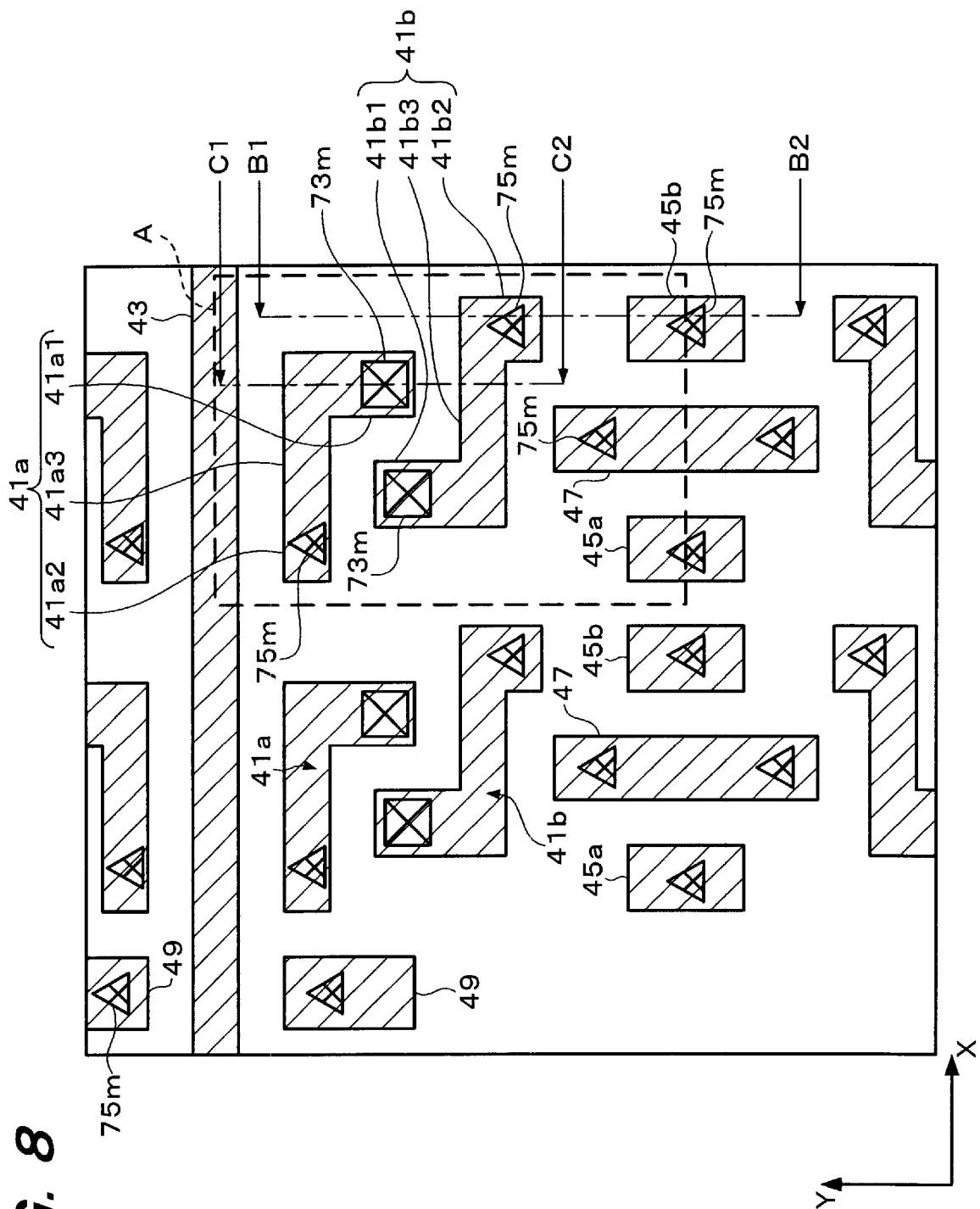
FIG. 8 is a plan view showing the third conductive layer in part of the memory cell array of the embodiment of the present invention.

Gate electrode layers 21a and 21b and sub-word lines 23 are disposed in the first conductive layer, as shown in FIG. 3. Drain-drain connecting layers 31a and 31b and the like are disposed in the second conductive layer, as shown in FIG. 5. Drain-gate connecting layers 41a and 41b and the like are disposed in the third conductive layer, as shown in FIG. 8. The structure shown in FIG. 5 is positioned on the structure shown in FIG. 3, and the structure shown in FIG. 8 is positioned on the structure shown in FIG. 5. FIG. 1 shows these structures collectively.

FIG. 1 shows a section which forms a flip-flop. This section is described below focusing on a region A. One memory cell is formed in the region A. The region A shown in other figures has the same meaning.

Figure 16:
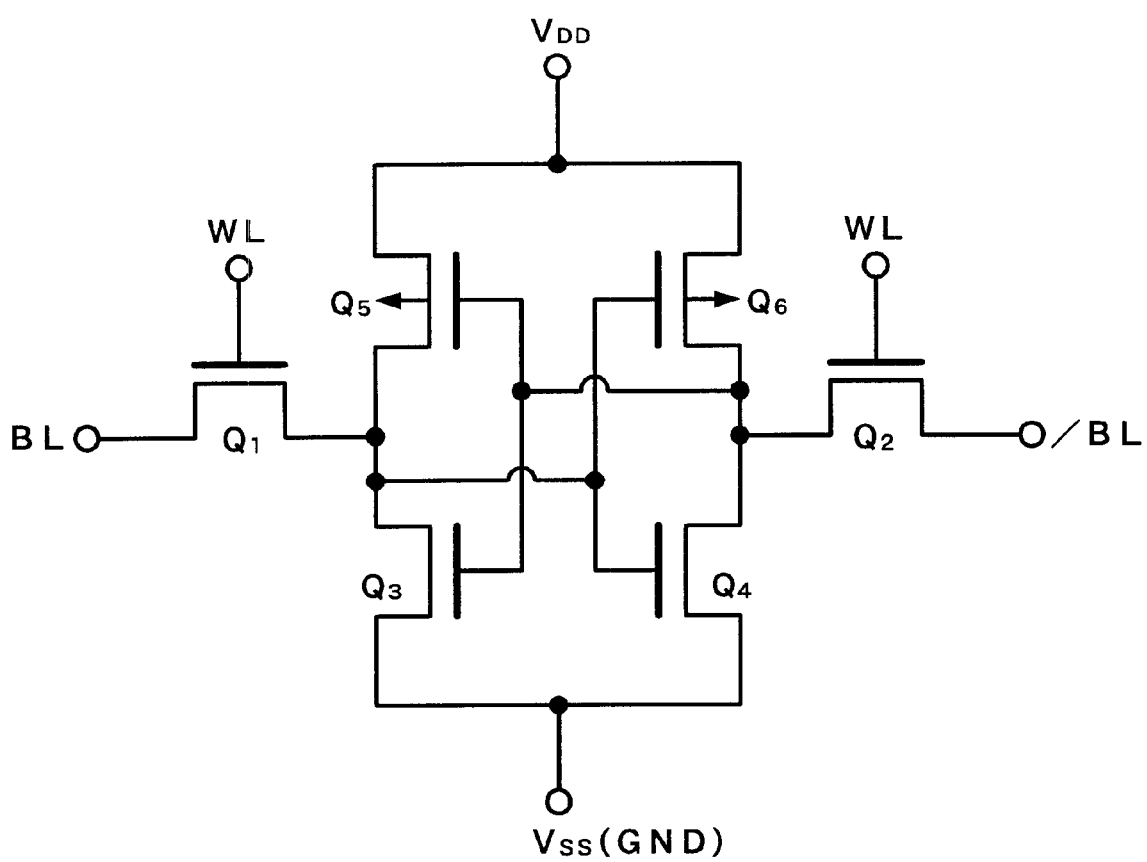
FIG. 16 is an equivalent circuit diagram of the SRAM according to the embodiment of the present invention.

In the region A, six MOS field effect transistors including n-channel transfer transistors $Q_1$ and $Q_2$, n-channel driver transistors $Q_3$ and $Q_4$, and p-channel load transistors $Q_5$ and $Q_6$ are formed. The driver transistor $Q_3$ and the load transistor $Q_5$ form one CMOS inverter. The driver transistor $Q_4$ and the load transistor $Q_6$ form one CMOS inverter. A flip-flop is formed by cross-coupling these two CMOS inverters. FIG. 16 shows an equivalent circuit of the circuit formed by the six MOS field effect transistors in the region A.

The gate electrode layer 21a and the gate electrode layer 21b respectively have a linear pattern, as shown in FIG. 1. The gate electrode layer 21a forms gate electrodes of the driver transistor $Q_3$ and the load transistor $Q_5$ and connects these gate electrodes. The gate electrode layer 21b forms gate electrodes of the driver transistor $Q_4$ and the load transistor $Q_6$ and connects these gate electrodes.

A drain region of the driver transistor $Q_3$ and a drain region of the load transistor $Q_5$ are connected by the drain-drain connecting layer 31a. A drain region of the driver transistor $Q_4$ and a drain region of the load transistor $Q_6$ are connected by the drain-drain connecting layer 31b. The drain-drain connecting layer 31a and the drain-drain connecting layer 31b respectively have a linear pattern.

The gate electrode (gate electrode layer 21a) of the driver transistor $Q_3$ and the load transistor $Q_5$ and the drain-drain connecting layer 31b are connected by the drain-gate connecting layer 41b. The gate electrode (gate electrode layer 21b) of the driver transistor $Q_4$ and the load transistor $Q_6$ and the drain-drain connecting layer 31a are connected by the drain-gate connecting layer 41a. The drain-gate connecting layer 41a and the drain-gate connecting layer 41b respectively have a pattern in the shape of the letter "L". The angle formed by the first side and the second side of the L-shaped pattern is approximately 90°. The first side of the drain-gate connecting layer 41a faces the first side of the drain-gate connecting layer 41b. The second side of the drain-gate connecting layer 41a faces the second side of the drain-gate connecting layer 41b. The drain-gate connecting layer 41a and the drain-gate connecting layer 41b are approximately point-symmetrical.

The gate electrode layer 21a, the gate electrode layer 21b, the drain-drain connecting layer 31a, and the drain-drain connecting layer 31b are disposed in parallel. The gate electrode layers 21a and 21b are located between the drain-drain connecting layer 31a and the drain-drain connecting layer 31b.

1.2 Structure of Memory Cell

Figure 2:
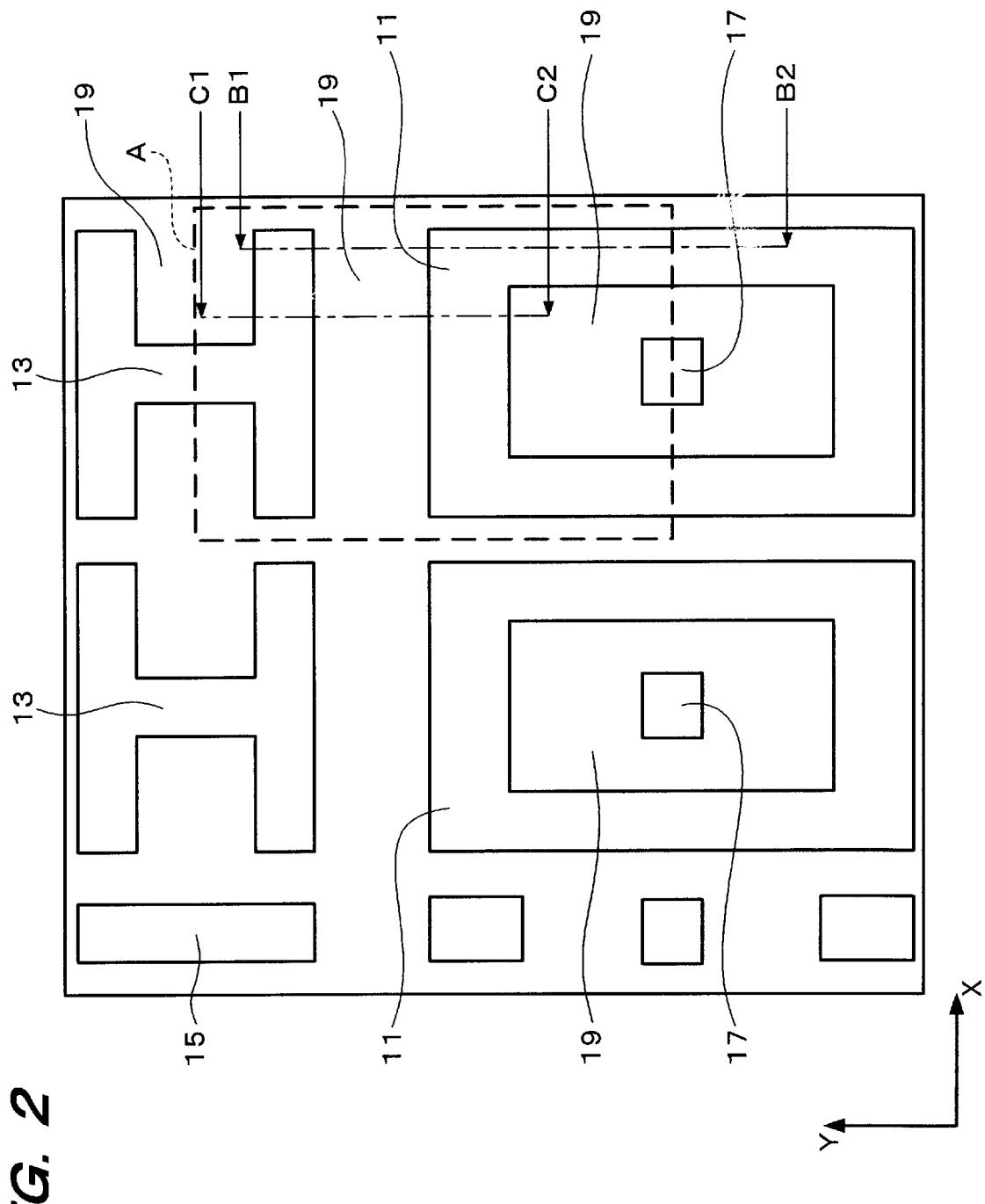
FIG. 2 is a plan view showing a field in part of the memory cell array of the embodiment of the present invention.
Figure 10:
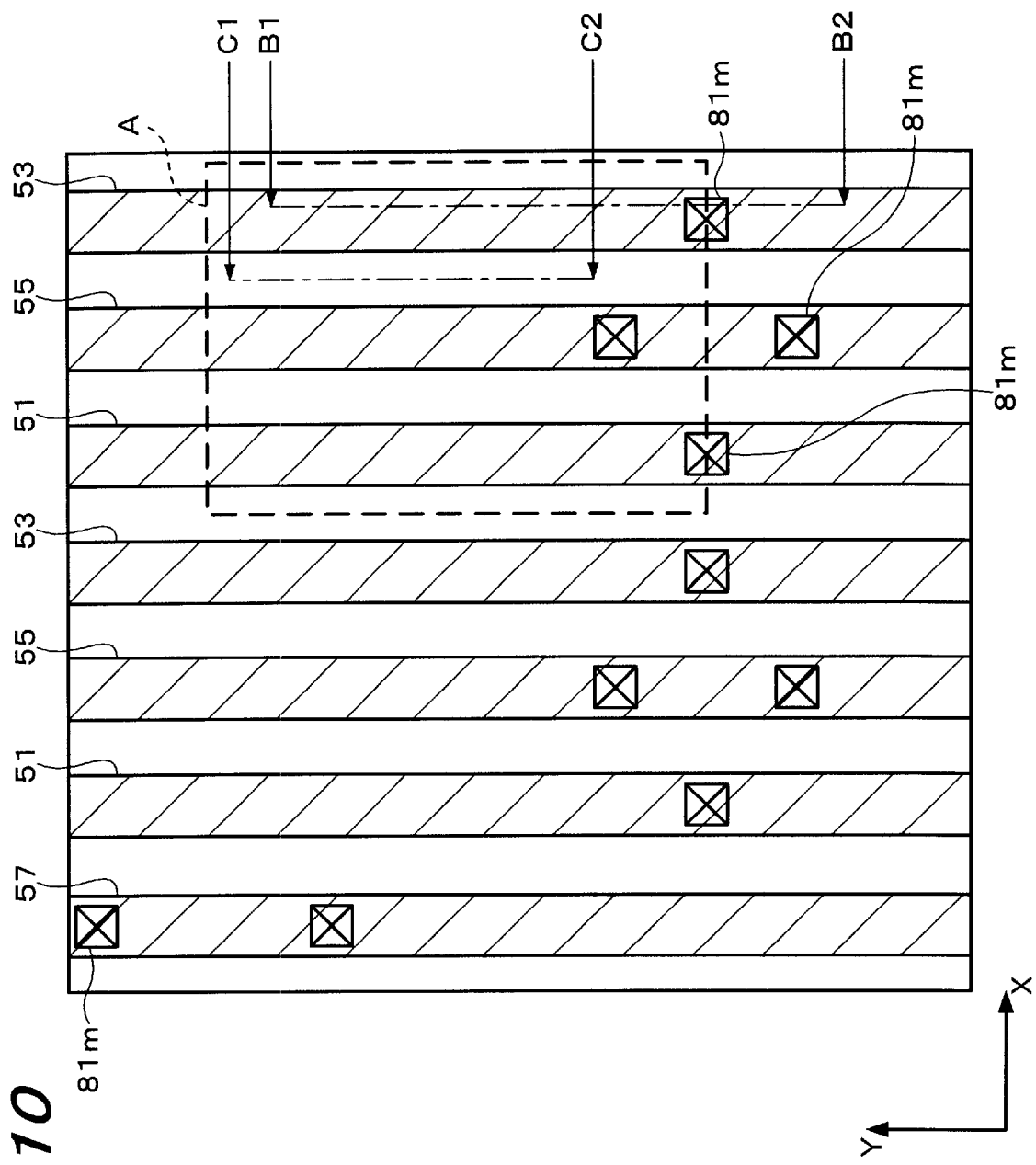
FIG. 10 is a plan view showing a fourth conductive layer in part of a memory cell array of the embodiment of the present invention.

The structure of the memory cell of the present embodiment is described below. The memory cell of the present embodiment has a structure in which the first conductive layer, the second conductive layer, the third conductive layer, and the fourth conductive layer are laminated on a field with interlayer dielectrics interposed. The field is a region in which active regions 11, 13, 15, and 17 and element isolation regions 19 are located, as shown in FIG. 2. Bit lines 51 and the like are formed in the fourth conductive layer, as shown in FIG. 10. The memory cell of the present embodiment has a structure in which the first conductive layer, the second conductive layer, and the third conductive layer shown in FIG. 1 are located on the field shown in FIG. 2. The fourth conductive layer shown in FIG. 10 is located above the third conductive layer.

2. Details of Structure of the Embodiment

Figure 13:
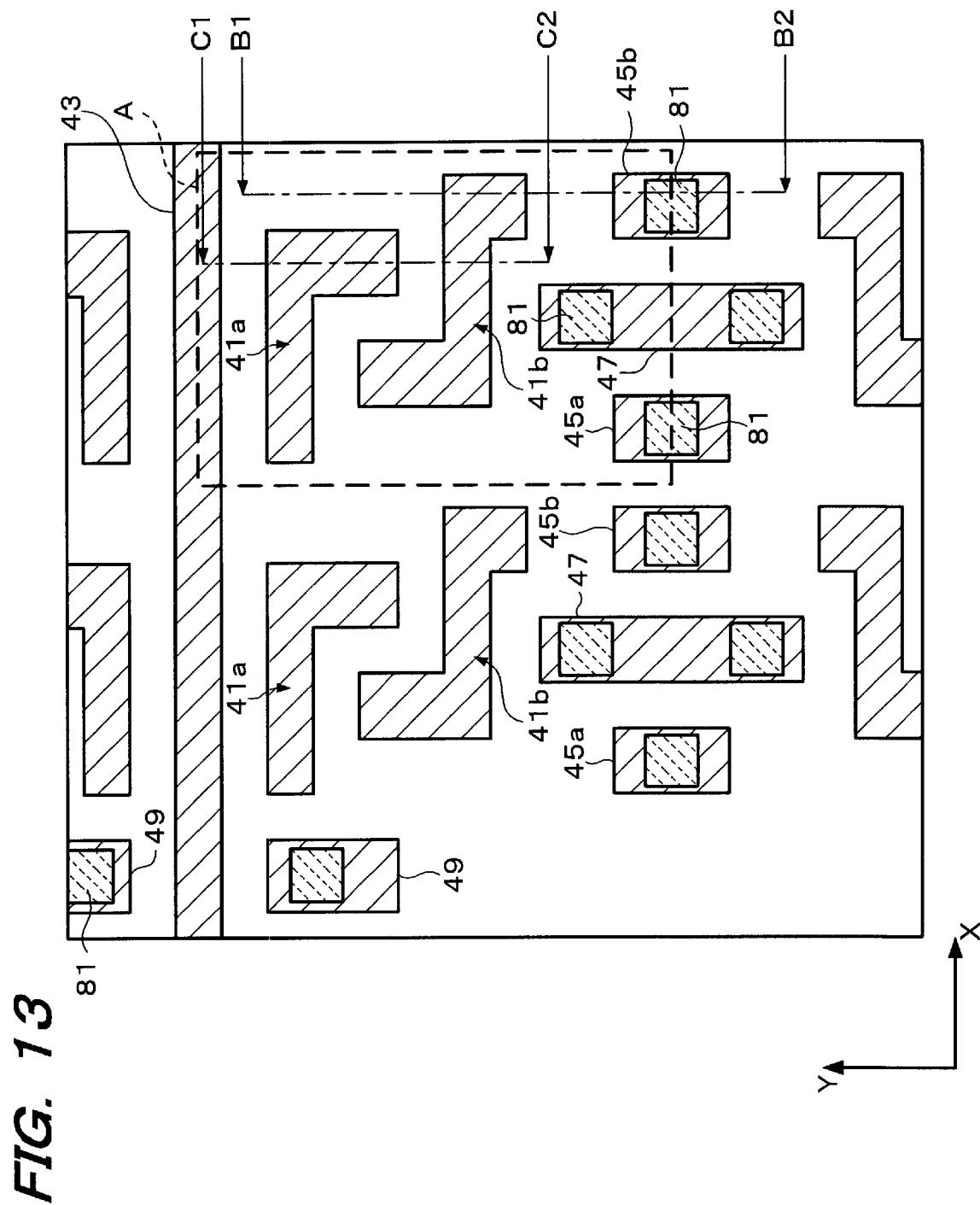
FIG. 13 is a plan view showing the third conductive layer and the contact-conductive sections 81 in the embodiment of the present invention.
Figure 14:
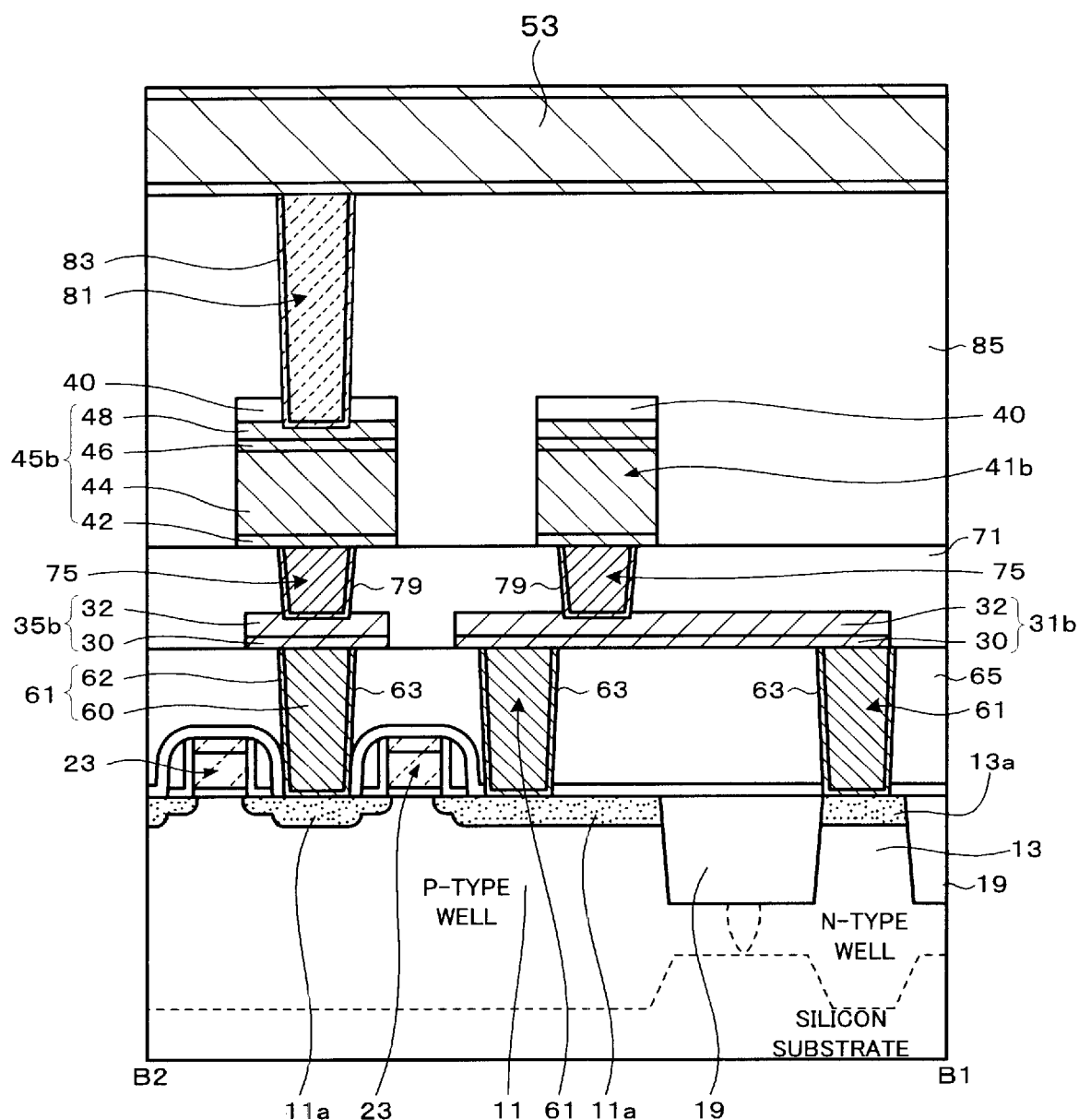
FIG. 14 is a cross-sectional view of the embodiment of the present invention taken along the line B1-B2 of FIG. 2.
Figure 15:
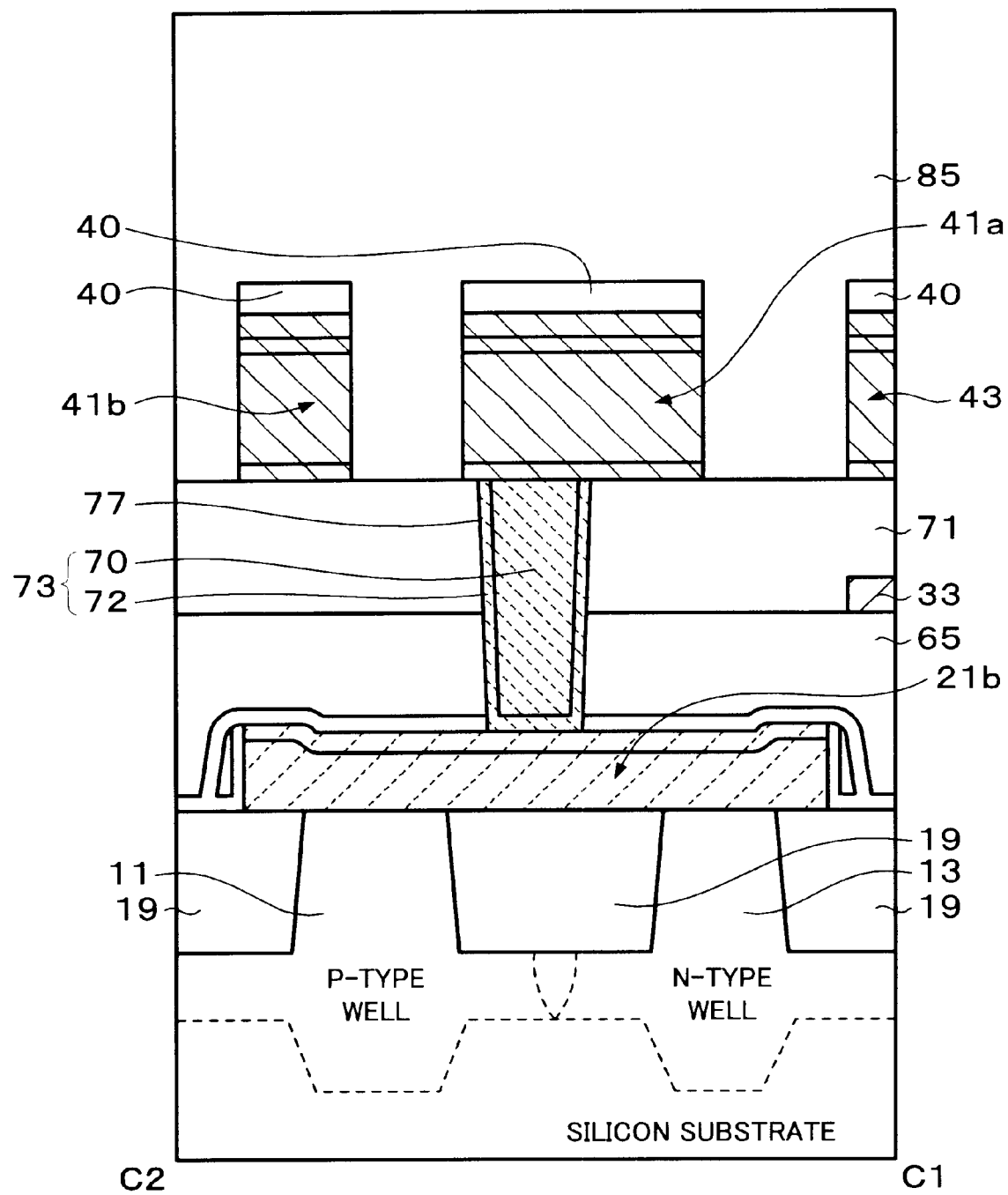
FIG. 15 is a cross-sectional view of the embodiment of the present invention taken along the line C1-C2 of FIG. 2.

The details of the structure of the present embodiment are described below with reference to FIGS. 2 to 15 in the order from the lower layers. Note that a line B1-B2 and a line C1-C2 are drawn in FIGS. 2 to 13. FIG. 14 is a view showing the cross section along the line B1-B2. FIG. 15 is a view showing the cross-section along the line C1-C2.

2.1 Field and First Conductive Layer

Figure 11:
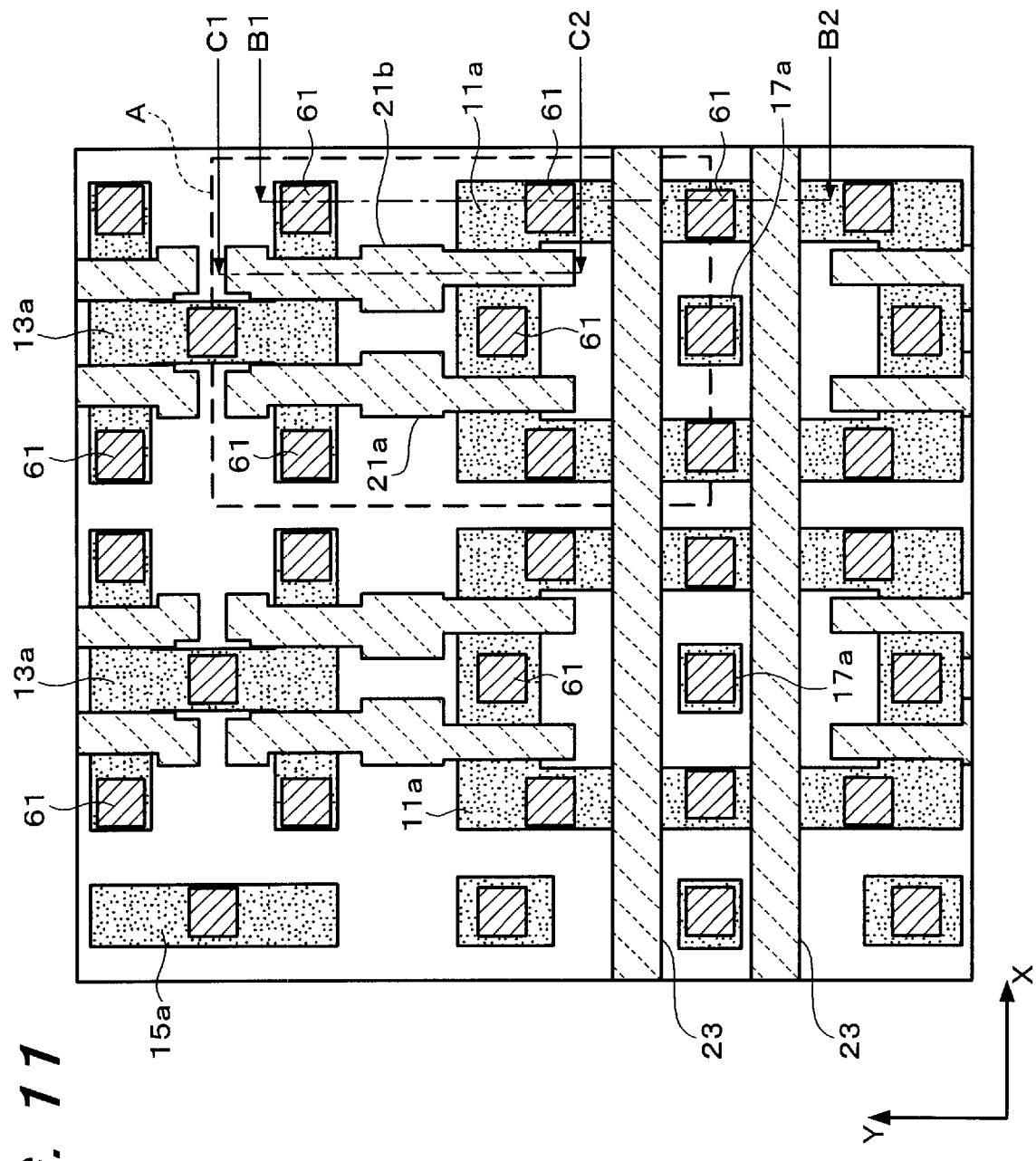
FIG. 11 is a plan view showing the field, first conductive layer, and contact-conductive sections 61 in the embodiment of the present invention.

FIG. 11 is a plan view showing the field and the first conductive layer. First, the field is described with reference to FIGS. 2, 14 and 15. FIG. 2 is a plan view showing the field. The field includes the active regions 11, 13, 15, and 17 and the element isolation regions 19. The active regions 11, 13, 15, and 17 are formed on the surface of a silicon substrate.

The active regions 11 have a rectangular shape with a rectangular opening formed therein. In FIG. 2, a plurality of the active regions 11 is arrayed in the X-axial direction. The transfer transistors $Q_1$ and $Q_2$ and the driver transistors $Q_3$ and $Q_4$ shown in FIG. 1 are formed in the active regions 11.

The active regions 13 resemble the letter "H" in shape. In FIG. 2, a plurality of the active regions 13 is arrayed in the X-axial direction. The load transistors $Q_5$ and $Q_6$ shown in FIG. 1 are formed in the active regions 13.

The active regions 15 are formed in every 32 memory cells arrayed in the X-axial direction, for example. A well contact region of an n well is formed in the active region 15.

An n well corresponding to 32 memory cells is connected to a $V_{DD}$ line (power supply line) with the well contact region interposed.

The active regions 17 are formed in every two memory cells arrayed in the Y-axial direction. A well contact region of a p well is formed in the active region 17. A p well corresponding to two memory cells is connected to a $V_{SS}$ line (ground line) with the well contact region interposed.

The active regions 11, 13, 15, and 17 are isolated from one another by the element isolation regions 19 (thickness: 400 nm, for example). The element isolation regions 19 are formed by STI (Shallow Trench Isolation), for example.

FIGS. 14 and 15 show the cross sections of the field along the line B1-B2 and the line C1-C2 shown in FIG. 2, respectively. The active regions 11 and 13 and the element isolation region 19 are shown in these cross sections.

The first conductive layer located on the field is described below with reference to FIGS. 3, 11, 14 and 15. FIG. 3 is a plan view showing the first conductive layer. The plurality of gate electrode layers 21a and 21b and the plurality of sub-word lines 23 are disposed in the first conductive layer. The gate electrode layers 21a and 21b and the sub-word lines 23 have a structure in which a silicide layer is formed on a polysilicon layer, for example.

The gate electrode layers 21a and 21b respectively have a linear pattern extending in the Y-axial direction in FIG. 3. A pair of the gate electrode layers 21a and 21b is disposed in parallel in each memory cell region. The gate electrode layers 21a and 21b become the gate electrodes of the driver transistors $Q_3$ and $Q_4$ and the load transistors $Q_5$ and $Q_6$ shown in FIG. 1. The gate length of the driver transistors $Q_3$ and $Q_4$ is 0.18 μm, for example. The gate length of the load transistors $Q_5$ and $Q_6$ is 0.20 μm, for example.

The sub-word lines 23 have a linear pattern extending in the X-axial direction in FIG. 3. The sub-word lines 23 are located on the driver transistor side. The sub-word lines 23 are activated or deactivated by main-word lines located in the upper layer. The sub-word lines 23 become the gate electrodes of the transfer transistors. The gate length of the transfer transistors is 0.24 μm, for example.

FIGS. 14 and 15 show the cross sections of the first conductive layer along the line B1-B2 and the line C1-C2 shown in FIG. 3, respectively. The sub-word lines 23 and the gate electrode layer 21b are shown in these cross sections.

Source/drain regions and the like formed in the active regions are described below. n⁺-type source/drain regions 11a are formed in the active regions 11, as shown in FIG. 11. The source/drain region is a region which functions as at least either the source or drain. An n⁺-type well contact region 15a is formed in the active region 15. p⁺-type well contact regions 17a are formed in the active regions 17.

An interlayer dielectric 65 (not shown in FIG. 11) such as a silicon oxide layer is formed to cover the field and the first conductive layer. The interlayer dielectric 65 is planarized using CMP, as shown in FIGS. 14 and 15. A plurality of contact holes 63 for exposing the n⁺-type source/drain regions 11a and the like is formed in the interlayer dielectric 65. The contact holes 63 are filled with contact-conductive sections 61.

Each contact-conductive section 61 includes a plug 60 buried in the contact hole 63 and a high-melting-point metal nitride layer 62 located on the bottom and the side of the contact hole 63. As a material for the plugs 60, tungsten and the like can be used. As a material for the high-melting-point metal nitride layers 62, titanium nitride and the like can be used. The high-melting-point metal nitride layers 62 mainly function as barrier layers. The diameter at the upper end of the contact holes 63 is 0.30 μm, for example. The diameter at the lower end of the contact holes 63 is 0.24 μm, for example.

Figure 4:
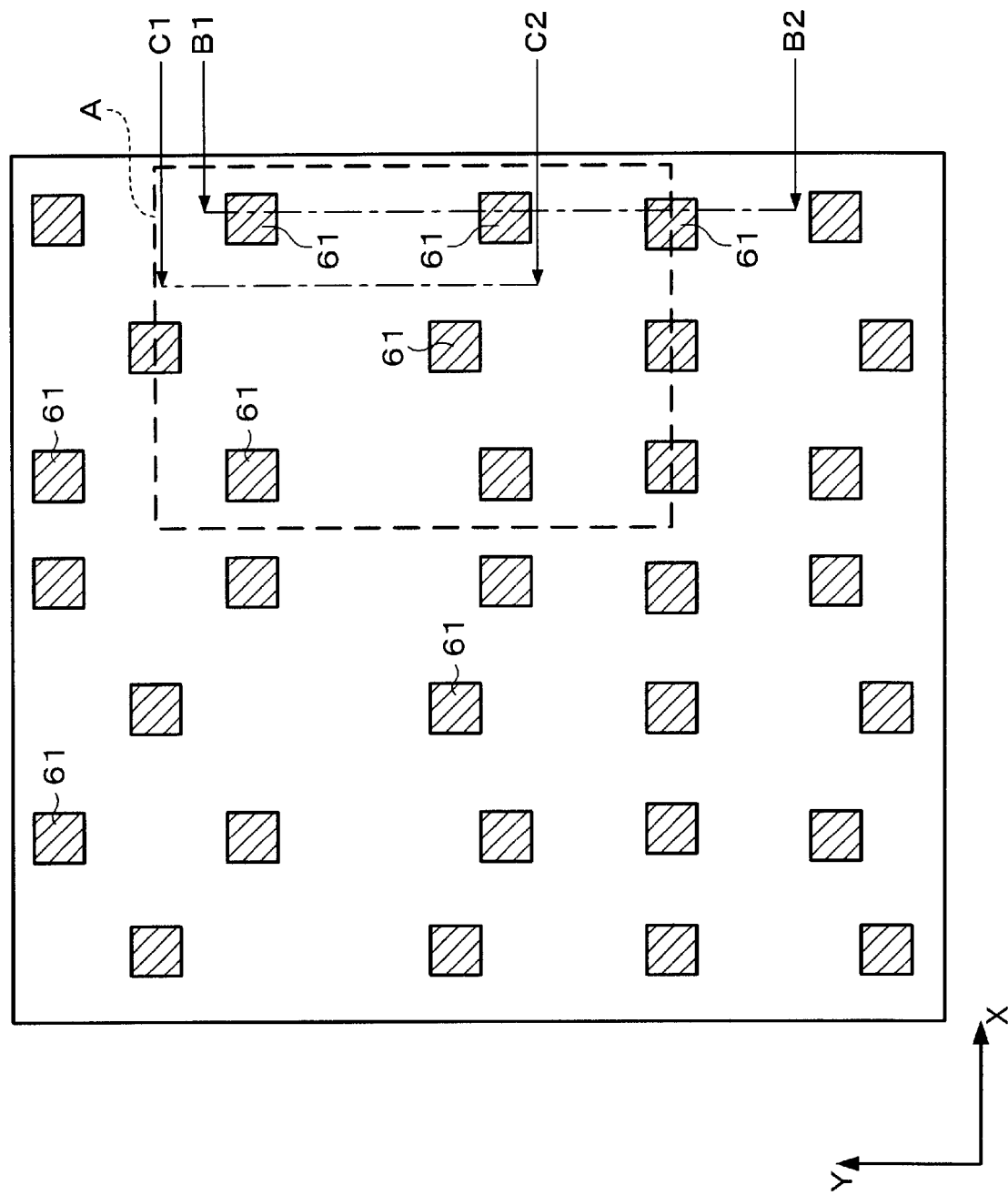
FIG. 4 is a plan view showing contact-conductive sections 61 in part of the memory cell array of the embodiment of the present invention.

FIG. 4 is a plan view showing the pattern of the contact-conductive sections 61. The contact-conductive sections 61 are connected to the n⁺-type source/drain regions 11a, the p⁺-type source/drain regions 13a, the n⁺-type well contact region 15a, and the p⁺-type well contact region 17a, as shown in FIG. 11.

2.2 Second Conductive Layer

The second conductive layer is located on the structure shown in FIG. 11. A plurality of the drain-drain connecting layers 31a and 31b, $V_{DD}$ line 33, a plurality of BL (bit line, bit line/) contact pad layers 35a and 35b, and a plurality of $V_{SS}$ local interconnects 37 are disposed in the second conductive layer, as shown in FIG. 5. For example, these layers and lines have a structure in which a high-melting-point metal nitride layer (thickness: 135 nm, for example) is formed on a high-melting-point metal layer (thickness: 8.5 nm, for example). The high-melting-point metal layer, which is an underlay, is formed of a titanium layer, for example. As the high-melting-point metal nitride layer, a titanium nitride layer can be given, for example. The structure of the drain-drain connecting layers 31a and 31b is described below. The $V_{SS}$ local interconnects 37 are used as local interconnects as well as contact pad layers.

The drain-drain connecting layers 31a and 31b respectively have a linear pattern extending in the Y-axial direction in FIG. 5. The width of a body section 31a3 of the drain-drain connecting layers 31a is smaller than the width of end sections 31a1 and 31a2 of the drain-drain connecting layers 31a. The width of a body section 31b3 of the drain-drain connecting layers 31b is smaller than the width of end sections 31b1 and 31b2 of the drain-drain connecting layers 31b. The width of the body sections 31a3 and 31b3 is a minimum design-rule width. A pair of the drain-drain connecting layers 31a and 31b is disposed in each memory cell region.

Each $V_{SS}$ local interconnect 37 has end sections and a body section extending in the Y-axial direction in FIG. 5. The width of the end sections of the $V_{SS}$ local interconnect 37 is greater than the body section. The $V_{SS}$ local interconnects 37 are located between the end section 31a2 of the drain-drain connecting layer 31a and the end section 31b2 of the drain-drain connecting layer 31b. The $V_{SS}$ local interconnects 37 extend from this location to between the end section 31a2 of the drain-drain connecting layer 31a and the end section 31b2 of the drain-drain connecting layer 31b in the memory cell located below in FIG. 5. One $V_{SS}$ local interconnect 37 is disposed in two memory cells.

The BL contact pad layers 35a function as pad layers for connecting the bit lines to the n⁺-type source/drain regions 11a (see FIG. 11). The BL contact pad layers 35b function as pad layers for connecting the bit lines/ to the n⁺-type source/drain regions 11a.

The BL contact pad layers 35a are located between the drain-drain connecting layer 31a of one memory cell and the drain-drain connecting layer 31a of the memory cell located below in FIG. 5. The BL contact pad layers 35b are located between the drain-drain connecting layer 31b of one memory cell and the drain-drain connecting layer 31b of the memory cell located below in FIG. 5. Each of the BL contact pad layers 35a and 35b is disposed in two memory cells.

The $V_{DD}$ line 33 has a linear pattern extending in the X-axial direction in FIG. 5. The $V_{DD}$ line 33 extends so as to three-dimensionally intersect the n⁺-type well contact region 15a (see FIG. 11). The $V_{DD}$ line 33 has branched sections 33a and 33b above the n⁺-type well contact region 15a.

The drain-drain connecting layers 31a and 31b, the $V_{DD}$ line 33, the BL contact pad layers 35a and 35b, and the $V_{SS}$ local interconnects 37 which are disposed in the second conductive layer shown in FIG. 5 are connected to the contact-conductive sections 61 shown in FIG. 11. These connections are indicated by contact sections 61m in FIG. 5.

The cross section of the second conductive layer shown in FIG. 5 along the line B1-B2 is shown in FIG. 14. The drain-drain connecting layer 31b and the BL contact pad layer 35b are shown in this cross section. The second conductive layer includes a high-melting-point metal layer 30 and a high-melting-point metal nitride layer 32 located on the high-melting-point metal layer 30, as described above.

Figure 12:
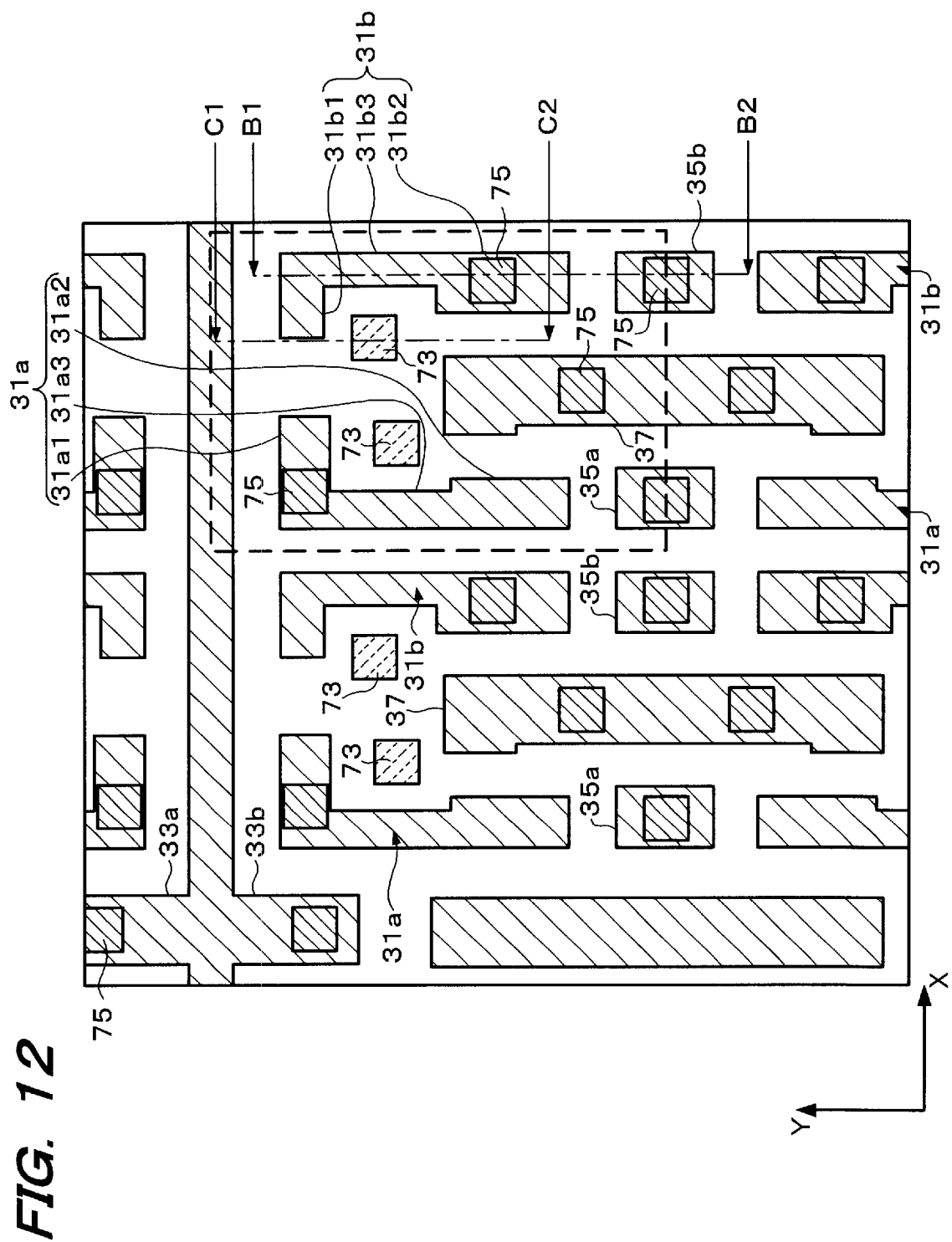
FIG. 12 is a plan view showing the second conductive layer and the contact-conductive sections 73 and 75 in the embodiment of the present invention.

An interlayer dielectric 71 (not shown in FIG. 5) such as a silicon oxide layer is formed to cover the second conductive layer. The interlayer dielectric 71 is planarized using CMP, as shown in FIGS. 14 and 15. A plurality of through-holes 79 for exposing the drain-drain connecting layers 31b and the like is formed in the interlayer dielectric 71. The through-holes 79 are filled with contact-conductive sections 75. A through-hole 77 for exposing the gate electrode layer 21b is formed in the interlayer dielectrics 71 and 65. The through-hole 77 is filled with contact-conductive section 73. FIG. 12 shows a planar relation between the contact-conductive sections 73 and 75 and the second conductive layer.

Figure 6:
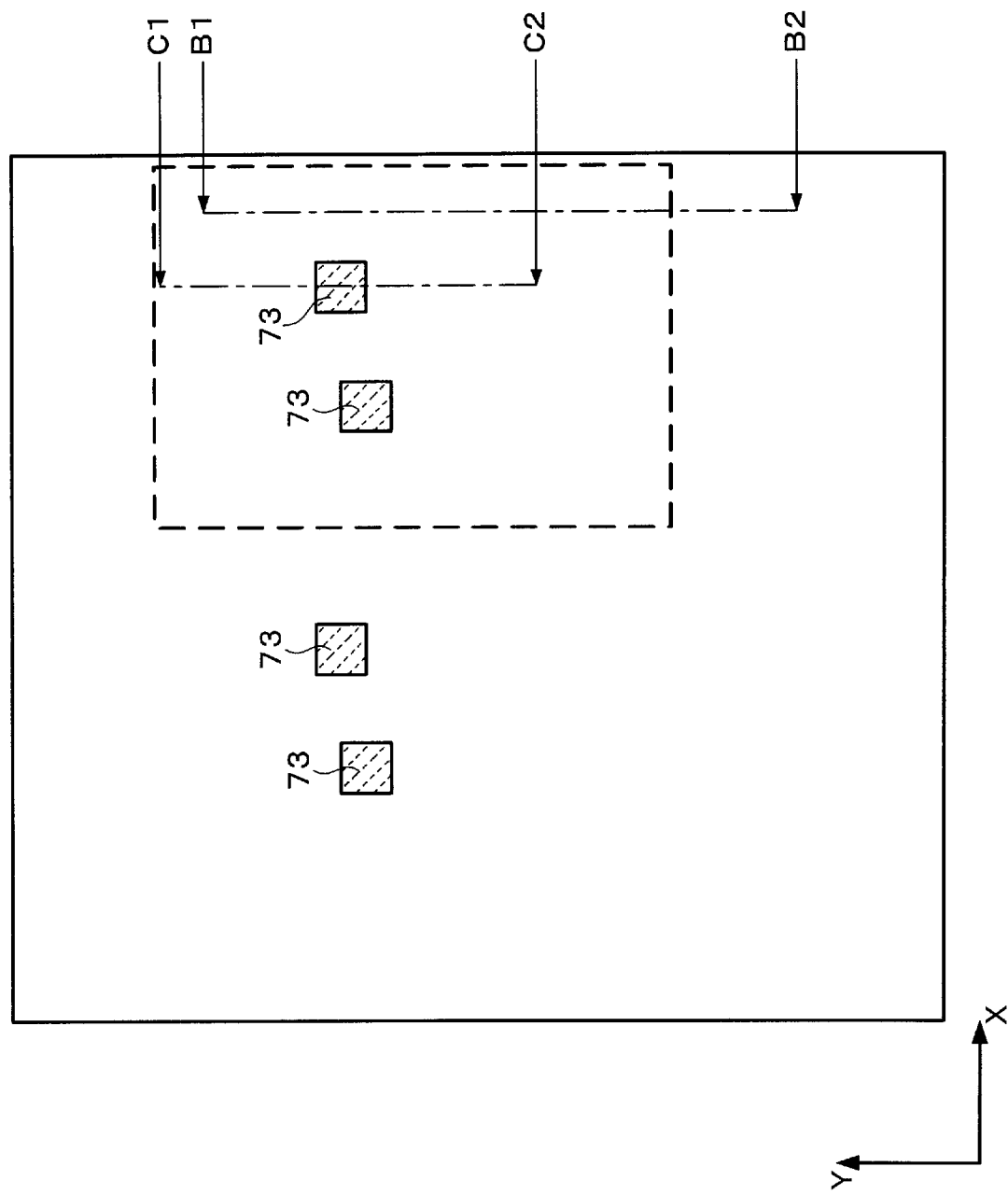
FIG. 6 is a plan view showing contact-conductive sections 73 in part of the memory cell array of the embodiment of the present invention.

The contact-conductive sections 73 are described below. FIG. 6 is a plan view showing the pattern of the contact-conductive sections 73. The contact-conductive sections 73 are connected to the gate electrode layers 21a and 21b (see FIG. 3). The cross section of the contact-conductive sections 73 is described below with reference to FIG. 15. The contact-conductive sections 73 are buried in the through-holes 77 formed through the interlayer dielectrics 65 and 71. In this cross section, the contact-conductive section 73 is connected to the gate electrode layer 21b. The contact-conductive section 73 includes a plug 70 buried in the through-hole 77 and a high-melting-point metal nitride layer 72 located on the bottom and the side of the through-hole 77. As a material for the plug 70, tungsten and the like can be used. As a material for the high-melting-point metal nitride layer 72, titanium nitride and the like can be used. The high-melting-point metal nitride layer 72 mainly functions as a barrier layer. The diameter at the upper end of the through-hole 77 is 0.32 µm, for example. The diameter at the lower end of the through-hole 77 is 0.24 µm, for example.

Figure 7:
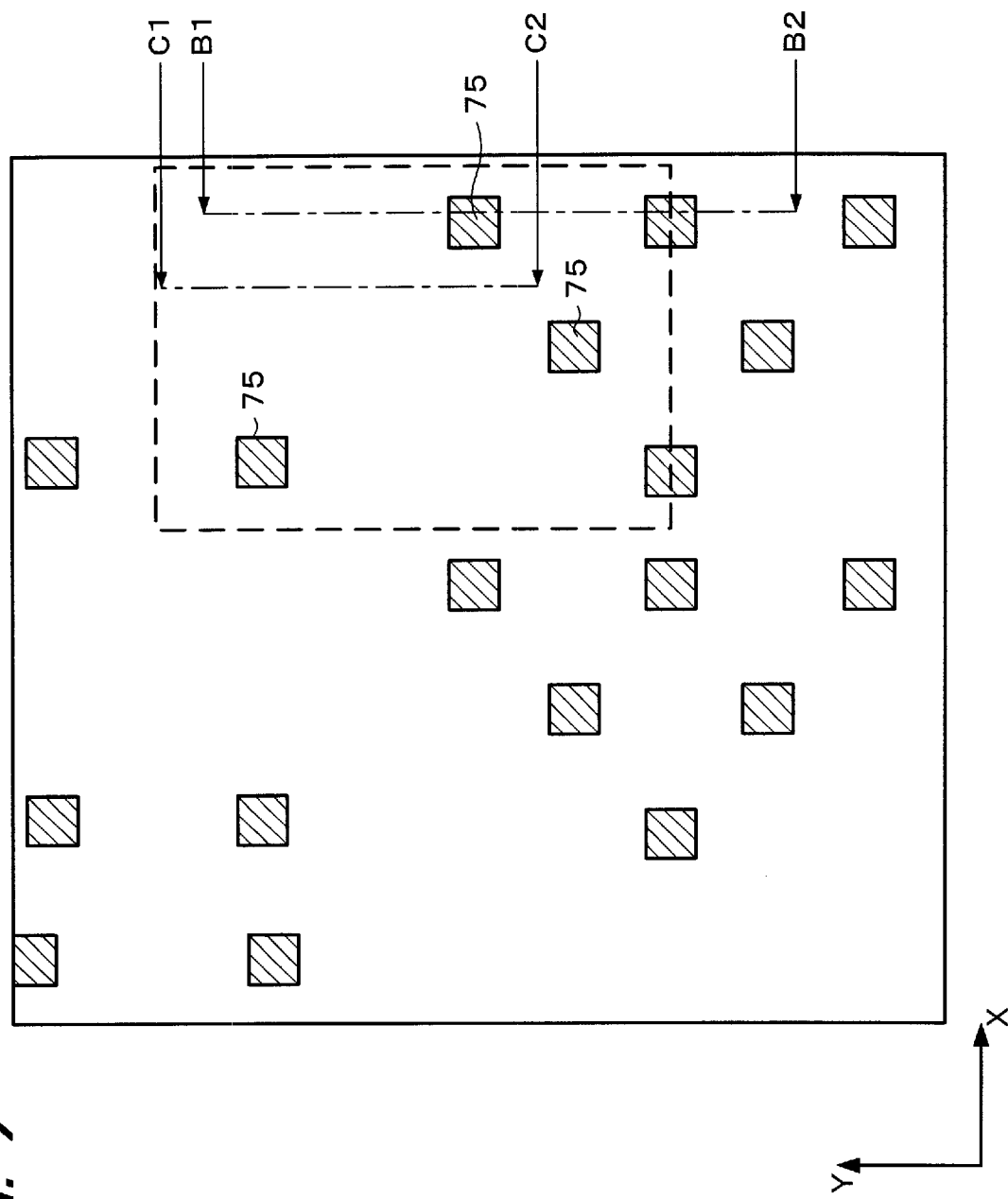
FIG. 7 is a plan view showing contact-conductive sections 75 in part of the memory cell array of the embodiment of the present invention.

The contact-conductive sections 75 are described below. FIG. 7 is a plan view showing the pattern of the contact-conductive sections. 75. The contact-conductive-sections 75 are connected to the end sections 31a1 of the drain-drain connecting layers 31a, the end sections 31b1 of the drain-drain connecting layers 31b, the branched sections 33a and 33b of the $V_{DD}$ line 33, the BL contact pad layers 35a and 35b, and the $V_{SS}$ local interconnects 37, as shown in FIG. 12. The cross section of the contact-conductive sections 75 is described with reference to FIG. 14. The contact-conductive sections 75 are buried in the through-holes 79 formed through the interlayer dielectric 71. In this cross section, the contact-conductive sections 75 are connected to the drain-drain connecting layer 31b and the BL contact pad layer 35b. Components of the contact-conductive sections 75 are the same as those of the contact-conductive sections 61 and 73. The diameter at the upper end of the through-holes 79 is 0.30 µm, for example. The diameter at the lower end of the through-holes 79 is 0.24 µm, for example.

2.3 Third Conductive Layer

The third conductive layer is located on the structure shown in FIG. 12. A plurality of the drain-gate connecting layers 41a and 41b, the main-word line 43, a plurality of BL contact pad layers 45a and 45b, a plurality of $V_{SS}$ contact pad layers 47, and a plurality of $V_{DD}$ contact pad layers 49 are disposed in the third conductive layer, as shown in FIG. 8.

Each drain-gate connecting layer 41a includes a body section 41a3 and two end sections 41a1 and 41a2. The body section 41a3 extends in the X-axial direction in FIG. 8. The end section 41a1 is bent toward the drain-gate connecting layer 41b. Each drain-gate connecting layer 41b includes a body section 41b3 and two end sections 41b1 and 41b2. The body section 41b3 extends in the X-axial direction in FIG. 8. The end section 41b1 is bent toward the drain-gate connecting layer 41a. A pair of the drain-drain connecting layers 41a and 41b is disposed in each memory cell region.

The BL contact pad layers 45a function as pad layers for connecting the bit lines to the $n^+$-type source/drain regions 11a. The BL contact pad layers 45b function as pad layers for connecting the bit lines/ to the $n^+$-type source/drain regions 11a. One BL contact pad layer 45a and one BL contact pad layer 45b are respectively disposed in two memory cells.

The $V_{SS}$ contact pad layers 47 extend in the Y-axial direction in FIG. 8 and have two end sections. The $V_{SS}$ contact pad layers 47 are located between the BL contact pad layers 45a and the BL contact pad layers 45b. One $V_{SS}$ contact pad layer 47 is disposed in two memory cells.

The main-word line 43 extends linearly in the X-axial direction in FIG. 8. The main-word line 43 is located above the $V_{DD}$ line shown in FIG. 8. The $V_{DD}$ contact pad layers 49 are located above the branched sections 33a and 33b of the $V_{DD}$ line 33 shown in FIG. 5. In the present embodiment, the word line consists of the sub-word lines 23 (see FIG. 3) and the main-word line 43 (see FIG. 8). The main word line may not be formed.

Each of the end sections 41a1 of the drain-gate connecting layers 41a and the end sections 41b1 of the drain-gate connecting layers 41b is connected to the contact-conductive sections 73 shown in FIG. 12. These connections are indicated by contact sections 73m in FIG. 8. Each of the end sections 41a2 of the drain-gate connecting layers 41a, the end sections 41b2 of the drain-gate connecting layers 41b, the BL contact pad layers 45a and 45b, the $V_{SS}$ contact pad layers 47, and the $V_{DD}$ contact pad layers 49 is connected to the contact-conductive sections 75 shown in FIG. 12. These connections are indicated by contact sections 75m in FIG. 8.

FIGS. 14 and 15 show the cross sections of the third conductive layer along the line B1-B2 and the line C1-C2 shown in FIG. 8, respectively. The drain-gate connecting layers 41a and 41b, the BL contact pad layer 45b, and the main-word line 43 are shown in these cross sections. The third conductive layer including these members has a structure in which a high-melting-point metal nitride layer 42, a metal layer 44, a high-melting-point metal layer 46, and a high-melting-point metal nitride layer 48 are laminated in that order, for example. Specific examples of each layer are as follows. As an example of the high-melting-point metal nitride layer 42, a titanium nitride layer can be given. As an example of the metal layer 44, an aluminum layer, a copper layer, and an alloy layer of these metals can be given. As an example of the high-melting-point metal layer 46, a titanium layer can be given. As an example of the high-melting-point metal nitride layer 48, a titanium nitride layer can be given.

Hard mask layers 40 formed of a silicon oxide layer are formed on the third conductive layer. The third conductive layer is patterned using the hard mask layers 40 as masks. This is because it is difficult to pattern the third conductive layer using only a resist as a mask due to miniaturization of memory cells.

Figure 9:
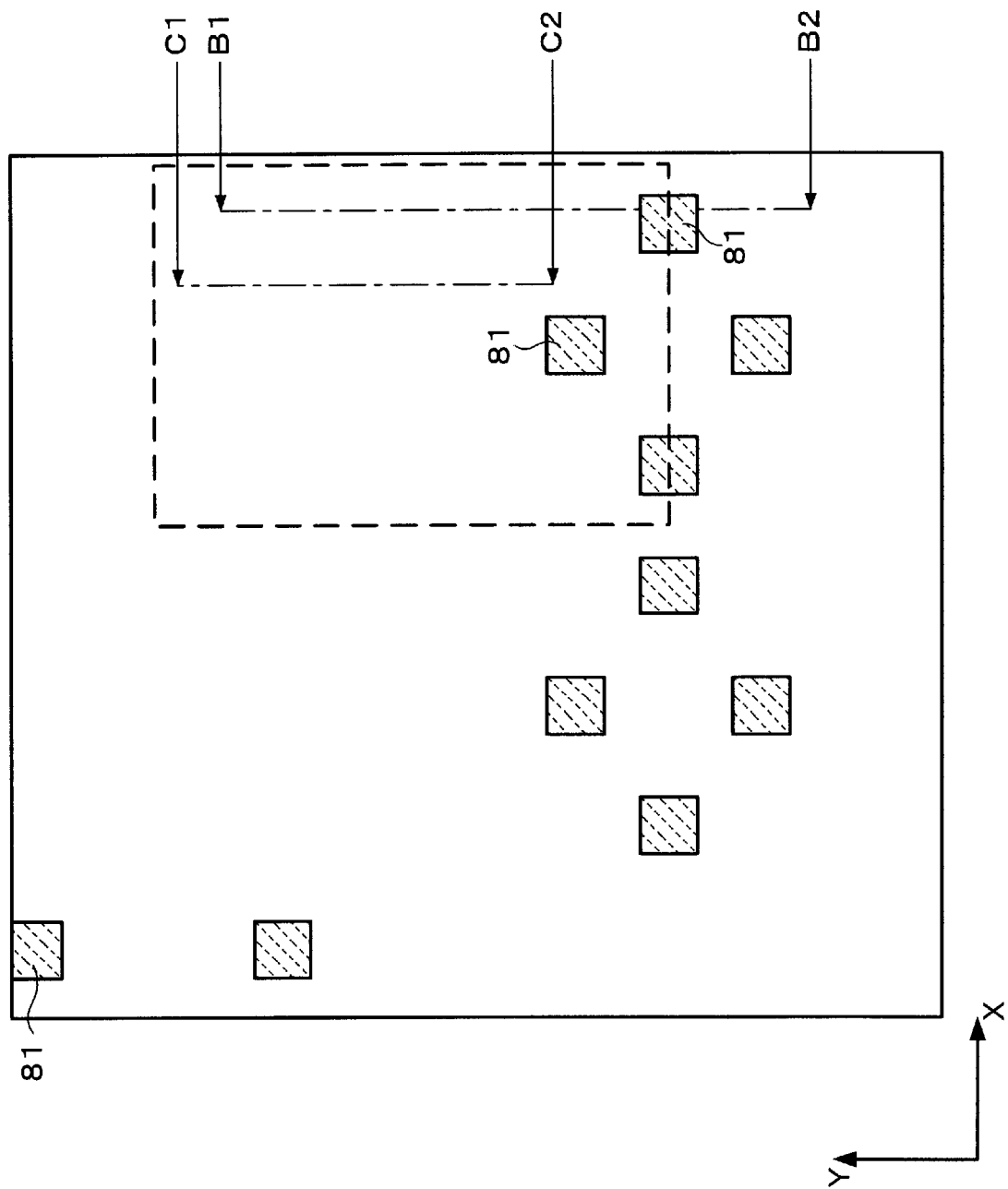
FIG. 9 is a plan view showing contact-conductive sections 81 in part of the memory cell array of the embodiment of the present invention.

An interlayer dielectric 85 such as a silicon oxide layer is formed to cover the third conductive layer. The interlayer dielectric 85 is planarized using CMP, as shown in FIGS. 14 and 15. Through-holes 83 for exposing the BL contact pad layers 45a and the like are formed in the interlayer dielectric 85. The through-holes 83 are filled with contact-conductive sections 81. FIG. 13 is a plan view showing this configuration. The contact-conductive sections 81 are connected to the BL contact pad layers 45a and 45b, the $V_{SS}$ contact pad layers 47, and the $V_{DD}$ contact pad layers 49, as shown in FIG. 13. FIG. 9 is a plan view showing the pattern of the contact-conductive sections 81. Components of the contact-conductive sections 81 are the same as those of the contact-conductive sections 61, 73, and 75. The diameter at the upper end of the through-holes 83 is 0.36 μm, for example. The diameter at the lower end of the through-holes 83 is 0.28 μm, for example.

2.4 Fourth Conductive Layer

The fourth conductive layer is located on the structure shown in FIG. 13. A plurality of bit lines 51, a plurality of bit lines/ 53, a plurality of $V_{SS}$ lines 55, and a $V_{DD}$ line 57 are disposed in the fourth conductive layer, as shown in FIG. 10. These lines extend linearly in the Y-axial direction in FIG. 10. The $V_{SS}$ lines 55 are disposed between the bit lines 51 and the bit lines/ 53 at the center of the memory cells. One $V_{DD}$ line 57 is disposed in every 32 memory cells arrayed in the X-axial direction. Each of these lines is connected to the contact-conductive sections 81 shown in FIG. 13. These connections are indicated by contact sections 81m in FIG. 10. The bit lines 51 and the like have a structure in which a titanium nitride layer, an aluminum-copper alloy layer, and a titanium nitride layer are laminated in that order, for example.

The cross section of the fourth conductive layer shown in FIG. 10 along the line B1-B2 is shown in FIG. 14. The bit line/ 53 is shown in this cross section. A signal which compensates a signal flowing through the bit lines 51 flows through the bit lines/ 53. The details of the structure of the present embodiment are described above.

The patterns shown in FIGS. 1 to 13 are design patterns. These patterns have corner sections. However, in a pattern actually formed on the semiconductor substrate, a line which specifies the corner sections is curved due to the proximity effect of light.

3. Major Effects of the Embodiment

Major effects of the present embodiment are described below.

(1) According to the present embodiment, the size of the SRAM can be reduced. The reasons therefor are described below using the relation of the connection between the drain-gate connecting layer 41a and the gate electrode layer 21b (see FIG. 1). This also applies to the relation of the connection between the drain-gate connecting layer 41b and the gate electrode layer 21a.

Assume that the connection structure consisting of the contact-conductive sections 61, the contact pad layer 35b, and the contact-conductive sections 75 shown in FIG. 14 is used to connect the drain-gate connecting layer 41a to the gate electrode layer 21b. Since the area of the contact pad layers 35b is greater than the area of the contact-conductive sections 61 and 75, the interval between the drain-drain connecting layer 31a and the drain-drain connecting layer 31b shown in FIG. 12 becomes greater to that extent.

According to the present embodiment, the drain-gate connecting layer 41a is connected to the gate electrode layer 21b without forming a contact pad layer between the interlayer dielectric 65 and the interlayer dielectric 71. Because of this, the interval between the drain-drain connecting layer 31a and the drain-drain connecting layer 31b can be decreased, whereby the memory cell size can be reduced.

In the present embodiment, the plug 70 is used as the contact-conductive section 73, as shown in FIG. 15. Note that other materials may be used insofar as the materials can be formed in the through-hole and electrically connect the upper conductive layer to the lower conductive layer. For example, a through-hole is formed in the interlayer dielectric. A conductive layer which becomes the upper conductive layer is formed in the through-hole and on the interlayer dielectric. The conductive layer is patterned, thereby forming the upper conductive layer. In this case, the conductive layer in the through-hole becomes the contact-conductive section 73. In the present embodiment, the contact-conductive section 73 includes the high-melting-point metal nitride layer 72. The contact-conductive section 73 may be formed of only the plug 70. These modifications also apply to the contact-conductive sections 61, 75, and 81.

(2) According to the present embodiment, the size of the SRAM can also be reduced by the following feature. In the present embodiment, information is stored using a flip-flop of the memory cell. A flip-flop is formed by connecting an input terminal (gate electrode) of a first inverter to an output terminal (drain) of a second inverter, and connecting an input terminal (gate electrode) of the second inverter to an output terminal (drain) of the first inverter. Specifically, the flip-flop is formed by cross-coupling the first inverter and the second inverter. In the case of forming a flip-flop using two layers, the inverters can be cross-coupled by forming each of a drain-drain connecting layer for connecting the drains of the inverters and a drain-gate connecting layer for connecting the gate and the drain of the inverters as one conductive layer.

According to this structure, these conductive layers are formed over regions including a region in which the drain of one inverter is located, a region in which the gate of the other inverter is located, and a region for connecting these regions. Therefore, the conductive layer has a pattern with three ends (for example, a pattern having a branched section in the shape of the letter "T" or "h"), or a spiral pattern in which the arms are intricate. For example, Japanese Patent Application Laid-open No. 10-41409 discloses a pattern in the shape of the letter "T" in FIG. 1. A pattern in the shape of the letter "h" is disclosed by M. Ishida, et. al. in *International Electron Devices Meeting Technical Digest*, 1998, page 203, FIG. 4(b), for example. An example of a spiral pattern also can be seen in this *International Electron Devices Meeting Technical Digest*, page 203, FIG. 3(b). These complicated patterns make it difficult to accurately reproduce the shape of a minute pattern in a photo-etching process, whereby a desired pattern cannot be obtained. This hinders miniaturization of the memory cell size.

According to the present embodiment, the gate electrode layers (21a, 21b) which become the gates of the CMOS inverters, the drain-drain connecting layers (31a, 31b) for connecting the drains of the CMOS inverters, and the drain-gate connecting layers (41a, 41b) for connecting the gate of one CMOS inverter to the drain of the other CMOS inverter are respectively formed in different layers. Therefore, a flip-flop is formed using these three layers. Because of this, the pattern of each layer can be simplified (linearly, for example) in comparison with a case of forming a flip-flop using two layers. According to the present embodiment, since the pattern of each layer can be thus simplified, an SRAM of the 0.18 μm generation with a memory cell size of 4.5 μm² or less can be fabricated, for example.

(3) According to the present embodiment, through-holes (through-hole 77 shown in FIG. 15, for example) can be easily filled with the contact-conductive section 73. Generally, through-holes with an aspect ratio of 5 or less can be easily filled with the contact-conductive sections. According to the present embodiment, the depth and the lower end diameter of the through-hole filled with the contact-conductive section 73 (through-hole 77 shown in FIG. 15, for example) are respectively 0.75 μm and 0.24 μm. Therefore, the aspect ratio of the through-hole is 3.13. According to the present embodiment, since the aspect ratio of the through-hole is 5 or less, the through-hole can be easily filled with the contact-conductive section 73.

In the present- embodiment, the high-melting-point metal nitride layer 32 is used as the second conductive layer shown in FIG. 14 (drain-drain connecting layer 31b, for example). Because of this, the aspect ratio of the through-hole (through-hole 77 shown in FIG. 15, for example) can be adjusted to 5 or less. Specifically, since the through-hole 77 is formed through two interlayer dielectrics (interlayer dielectrics 65 and 71), the depth of the through-hole 77 is increased, as shown in FIG. 15. In the present embodiment, the high-melting-point metal nitride layer 32 is used as the second conductive layer shown in FIG. 14. The thickness of the high-melting-point metal nitride layer can be reduced in comparison with an aluminum layer. Therefore, according to the present embodiment, the thickness of the interlayer dielectric 71 (see FIG. 15) can be decreased in the region in which the second conductive layer is not formed. Because of this, the depth of the through-hole 77 can be decreased to that extent, whereby the aspect ratio of the through-hole 77 can be adjusted to 5 or less.

In the present embodiment, the second conductive layer has a structure in which the high-melting-point metal layer 30 and the high-melting-point metal nitride layer 32 are laminated, as shown in FIG. 14. Note that the second conductive layer may be formed of only the high-melting-point metal nitride layer 32.

What is claimed is:

1. A semiconductor memory device comprising,
a memory cell which is provided with a first driver transistor, a second driver transistor, a first load transistor, a second load transistor, a first transfer transistor, and a second transfer transistor, wherein:
the memory cell has a first gate electrode layer, a second gate electrode layer, a first drain-drain connecting layer, a second drain-drain connecting layer, a first drain-gate connecting layer, a second drain-gate connecting layer, a first contact-conductive section, a second contact-conductive section, a first interlayer dielectric, and a second interlayer dielectric;
the first gate electrode layer includes a gate electrode of the first driver transistor and a gate electrode of the first load transistor;
the second gate electrode layer includes a gate electrode of the second driver transistor and a gate electrode of the second load transistor;
the first interlayer dielectric is located so as to cover the first and second gate electrode layers;
the first and second drain-drain connecting layers are located over the first interlayer dielectric;
the first and second gate electrode layers are located between the first and second drain-drain connecting layers;
the first drain-drain connecting layer is used to connect a drain region of the first driver transistor to a drain region of the first load transistor;
the second drain-drain connecting layer is used to connect a drain region of the second driver transistor to a drain region of the second load transistor;
the second interlayer dielectric is located so as to cover the first drain-drain connecting layer and the second drain-drain connecting layer;
the first and second drain-gate connecting layers are located over the second interlayer dielectric;
the first drain-gate connecting layer is used to connect the first drain-drain connecting layer to the second gate electrode layer;
the second drain-gate connecting layer is used to connect the second drain-drain connecting layer to the first gate electrode layer;
the first contact-conductive section is located in a first hole formed in a region from the first interlayer dielectric to the second interlayer dielectric;
the second contact-conductive section is located in a second hole formed in a region from the first interlayer dielectric to the second interlayer dielectric;
the first drain-gate connecting layer is connected to the second gate electrode layer with the first contact-conductive section interposed; and
the second drain-gate connecting layer is connected to the first gate electrode layer with the second contact-conductive section interposed.

2. The semiconductor memory device as defined in claim 1,
wherein each of the first and second holes has an aspect ratio of 5 or less.

3. The semiconductor memory device as defined in claim 1,
wherein each of the first and second drain-drain connecting layers has a thickness of 100 nm to 170 nm.

4. The semiconductor memory device as defined in claim 1,
wherein the first and second drain-drain connecting layers include a high-melting-point metal nitride layer.

5. The semiconductor memory device as defined in claim 1,
wherein the first gate electrode layer, the second gate electrode layer, the first drain-drain connecting layer and the second drain-drain connecting layer respectively have a linear pattern and are disposed in parallel.

6. The semiconductor memory device as defined in claim 1, wherein:
the memory cell further comprises a third contact-conductive section, a fourth contact-conductive section, a first contact pad layer and a second contact pad layer;
the first contact pad layer and the second contact pad layer are respectively located in the same level as the first drain-drain connecting layer and the second drain-drain connecting layer;
the third contact-conductive section and the fourth contact-conductive section are located in holes formed in the first interlayer dielectric;
a source/drain region of the first transfer transistor is connected to the first contact pad layer with the third contact-conductive section interposed; and
a source/drain region of the second transfer transistor is connected to the second contact pad layer with the fourth contact-conductive section interposed.

7. The semiconductor memory device as defined in claim 1, wherein:

the first and second driver transistors are n-type;

the first and second load transistors are p-type;

the first and second transfer transistors are n-type;

the memory cell includes a first conductive layer, a second conductive layer, a third conductive layer and a fourth conductive layer;

the first gate electrode layer, the second gate electrode layer, and a sub-word line are located in the first conductive layer;

the first drain-drain connecting layer, the second drain-drain connecting layer, a power supply line, a first contact pad layer, a second contact pad layer and a third contact pad layer are located in the second conductive layer;

the first drain-gate connecting layer, the second drain-gate connecting layer, a main-word line, a fourth contact pad layer, a fifth contact pad layer and a sixth contact pad layer are located in the third conductive layer;

a first bit line, a second bit line and a ground line are located in the fourth conductive layer;

the sub-word line extends in a first direction;

the power supply line is connected to source regions of the first and second load transistors;

the first contact pad layer is used to connect the first bit line to a source/drain region of the first transfer transistor;

the second contact pad layer is used to connect the second bit line to a source/drain region of the second transfer transistor;

the third contact pad layer is used to connect source regions of the first and second driver transistors to the ground line;

the main-word line extends in-the first direction;

the fourth contact pad layer is used to connect the first bit line to a source/drain region of the first transfer transistor;

the fifth contact pad layer is used to connect the second bit line to a source/drain region of the second transfer transistor;

the sixth contact pad layer is used to connect source regions of the first and second driver transistors to the ground line; and the first and second bit lines extend in a second direction which is perpendicular to the first direction.

8. The semiconductor memory device as defined in claim 1, wherein the memory cell is 4.5 $\mu^2$ or less in area.

* * * * *